US012500363B2

(12) United States Patent
Yu et al.

(10) Patent No.: US 12,500,363 B2
(45) Date of Patent: Dec. 16, 2025

(54) ELECTRICAL CONNECTOR, MANUFACTURING METHOD, AND CONNECTOR ASSEMBLY WITH IMPROVED RELIABILITY

(71) Applicant: Luxshare Precision Industry Company Limited, Shenzhen (CN)

(72) Inventors: Liang Yu, Shenzhen (CN); Min Fan, Shenzhen (CN)

(73) Assignee: LUXSHARE PRECISION INDUSTRY COMPANY LIMITED, Shenzhen (CN)

( * ) Notice: Subject to any disclaimer, the term of this patent is extended or adjusted under 35 U.S.C. 154(b) by 375 days.

(21) Appl. No.: 18/098,242

(22) Filed: Jan. 18, 2023

(65) Prior Publication Data

US 2023/0387615 A1 Nov. 30, 2023

(30) Foreign Application Priority Data

May 25, 2022 (CN) ......................... 202210573367.7

(51) Int. Cl.
*H01R 12/58* (2011.01)
*H01R 12/71* (2011.01)

(52) U.S. Cl.
CPC ......... *H01R 12/585* (2013.01); *H01R 12/716* (2013.01); *H05K 2201/1059* (2013.01)

(58) Field of Classification Search
CPC ......................... H01R 13/562; H01R 13/6658; H01R 12/585; H01R 12/53; H01R 12/716
USPC .......................................................... 439/751
See application file for complete search history.

(56) References Cited

U.S. PATENT DOCUMENTS

| | | | | |
|---|---|---|---|---|
| 2011/0008997 A1* | 1/2011 | Huang | ................. | H01R 12/778 439/499 |
| 2018/0375253 A1* | 12/2018 | Zheng | ................ | H01R 13/6272 |

FOREIGN PATENT DOCUMENTS

| | | | |
|---|---|---|---|
| CN | 201252240 | Y | 6/2009 |
| CN | 101958476 | A | 1/2011 |
| CN | 102801009 | A | 11/2012 |
| CN | 101888035 | B | 8/2013 |
| CN | 203521683 | U | 4/2014 |
| CN | 102801009 | B | * 11/2015 |
| CN | 209249780 | U | 8/2019 |

(Continued)

OTHER PUBLICATIONS

English translation of the description of CN-102801009-A (Year: 2012).*

*Primary Examiner* — Peter G Leigh
*Assistant Examiner* — Amara Anderson
(74) *Attorney, Agent, or Firm* — Birch, Stewart, Kolasch & Birch, LLP

(57) ABSTRACT

An electrical connector includes an insulating body, a conductive terminal, an adapter circuit board and a cable. The insulating body includes a terminal receiving groove extending along a first direction. The conductive terminal includes a fixing portion, a mating portion and a mounting portion. The mating portion is located in the terminal receiving groove. The transfer circuit board includes a conductive hole. The mounting portion of the conductive terminal is inserted into the conductive hole. The cable is electrically connected to the adapter circuit board. The cable extends in a second direction perpendicular to the first direction. A method for making the electrical connector and a connector assembly having the electrical connector are disclosed.

20 Claims, 17 Drawing Sheets

(56) References Cited

FOREIGN PATENT DOCUMENTS

| | | | |
|---|---|---|---|
| CN | 211045824 | U | 7/2020 |
| CN | 211743457 | U | 10/2020 |
| TW | 1506865 | B | 11/2015 |
| WO | 2016/195849 | A1 | 12/2016 |

* cited by examiner

ELECTRICAL CONNECTOR, MANUFACTURING METHOD, AND CONNECTOR ASSEMBLY WITH IMPROVED RELIABILITY

CROSS-REFERENCE TO RELATED APPLICATION

This patent application claims priority of a Chinese Patent Application No. 202210573367.7, filed on May 25, 2022 and titled "ELECTRICAL CONNECTOR, MANUFACTURING METHOD, AND CONNECTOR ASSEMBLY", the entire content of which is incorporated herein by reference.

TECHNICAL FIELD

The present disclosure relates to an electrical connector, a manufacturing method and a connector assembly, which belongs to a technical field of connectors.

BACKGROUND

A connector assembly in the related art generally includes a receptacle connector and a plug connector. The plug connector generally includes a plug insulating body, a plug conductive terminal, and a cable riveted and fixed with the plug conductive terminal. In some embodiments, when the cable needs to be at 90° with respect to an extension direction of the plug conductive terminal, in a connection manner of the cable and the plug conductive terminal in the related art, since the cable needs to be bent, a large space needs to be reserved at a bending position. This design is not beneficial to miniaturization of the connector. In addition, since the cable is prone to damage at the bending position, this design is also not beneficial to improve the product reliability.

SUMMARY

An object of the present disclosure is to provide an electrical connector, a manufacturing method and a connector assembly which are capable of realizing miniaturization and high product reliability.

In order to achieve the above object, the present disclosure adopts the following technical solution: an electrical connector, including: an insulating body defining a terminal receiving groove which extends along a first direction; a conductive terminal secured in the terminal receiving groove, the conductive terminal including a fixing portion fixed in the insulating body, a mating portion located on one side of the fixing portion, and a mounting portion located on an opposite side of the fixing portion; wherein the mating portion, the fixing portion and the mounting portion extend along the first direction, and the mating portion is located in the terminal receiving groove; an adapter circuit board including a conductive hole, the mounting portion of the conductive terminal being inserted into the conductive hole, the conductive terminal being electrically connected with the adapter circuit board; and a cable electrically connected to the adapter circuit board, the conductive terminal being electrically connected to the cable through the adapter circuit board, the cable extending in a second direction, the first direction and the second direction being perpendicular to each other.

In order to achieve the above object, the present disclosure adopts the following technical solution: a method of manufacturing the aforementioned electrical connector, the method including following steps: S1, providing the insulating body; S2, providing the conductive terminal and assembling the conductive terminal to the insulating body; S3, providing the adapter circuit board and the cable, and soldering or welding the cable to the adapter circuit board; and S4, mounting the adapter circuit board and the cable as a whole to the mounting portion of the conductive terminal.

In order to achieve the above object, the present disclosure adopts the following technical solution: a connector assembly, including: an electrical connector including: an insulating body defining a terminal receiving groove which extends along a first direction; a conductive terminal secured in the terminal receiving groove, the conductive terminal including a fixing portion fixed in the insulating body, a mating portion located on one side of the fixing portion, and a mounting portion located on an opposite side of the fixing portion; wherein the mating portion, the fixing portion and the mounting portion extend along the first direction, and the mating portion is located in the terminal receiving groove; an adapter circuit board including a conductive hole, the mounting portion of the conductive terminal being inserted into the conductive hole, the conductive terminal being electrically connected with the adapter circuit board; and a cable electrically connected to the adapter circuit board, the conductive terminal being electrically connected to the cable through the adapter circuit board, the cable extending in a second direction, the first direction and the second direction being perpendicular to each other; and a mating connector including a mating insulating body and a mating conductive terminal fixed to the mating insulating body, the mating insulating body including a mating receiving cavity, the mating conductive terminal including a needle-shaped insertion portion extending into the mating receiving cavity; wherein the insulating body is at least partially inserted into the mating receiving cavity, and the insertion portion of the mating conductive terminal is inserted into the mating portion of the conductive terminal.

Compared with the prior art, the present disclosure is provided with the adapter circuit board, and the conductive terminal is electrically connected to the cable through the adapter circuit board. The present disclosure avoids the problem that the cable needs to be bent when the cable is directly connected to the conductive terminal, thereby saving space and facilitating miniaturization. In addition, the present disclosure is beneficial to improve the reliability of the electrical connection between the cable and the conductive terminal.

DETAILED DESCRIPTION

Figure 1:
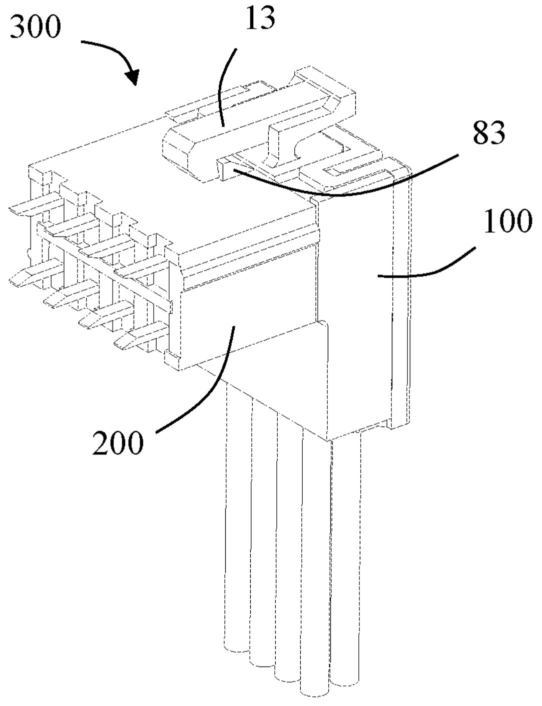
FIG. 1 is a schematic perspective view of a connector assembly in accordance with an embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms “a”, “said”, and “the” used in this application and the appended claims are also intended to include plural forms unless the context clearly indicates other meanings.

It should be understood that the terms “first”, “second” and similar words used in the specification and claims of this application do not represent any order, quantity or importance, but are only used to distinguish different components. Similarly, “an” or “a” and other similar words do not mean a quantity limit, but mean that there is at least one; “multiple” or “a plurality of” means two or more than two. Unless otherwise noted, “front”, “rear”, “lower” and/or “upper” and similar words are for ease of description only and are not limited to one location or one spatial orientation. Similar words such as “include” or “comprise” mean that elements or objects appear before “include” or “comprise” cover elements or objects listed after “include” or “comprise” and their equivalents, and do not exclude other elements or objects. The term “a plurality of” mentioned in the present disclosure includes two or more.

Hereinafter, some embodiments of the present disclosure will be described in detail with reference to the accompanying drawings. In the case of no conflict, the following embodiments and features in the embodiments can be combined with each other.

Figure 2:
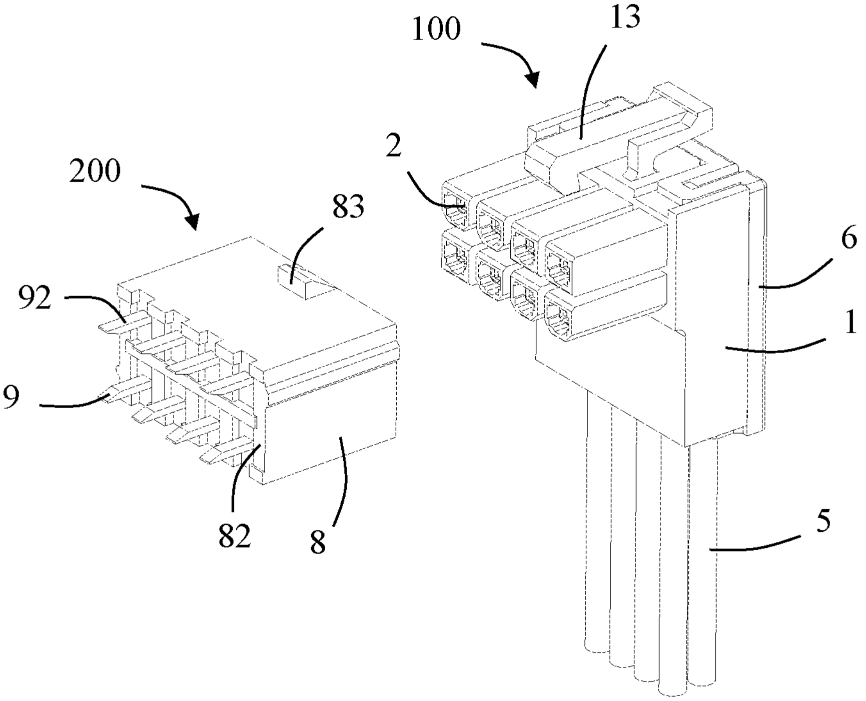
FIG. 2 is a perspective exploded view of FIG. 1.
Figure 3:
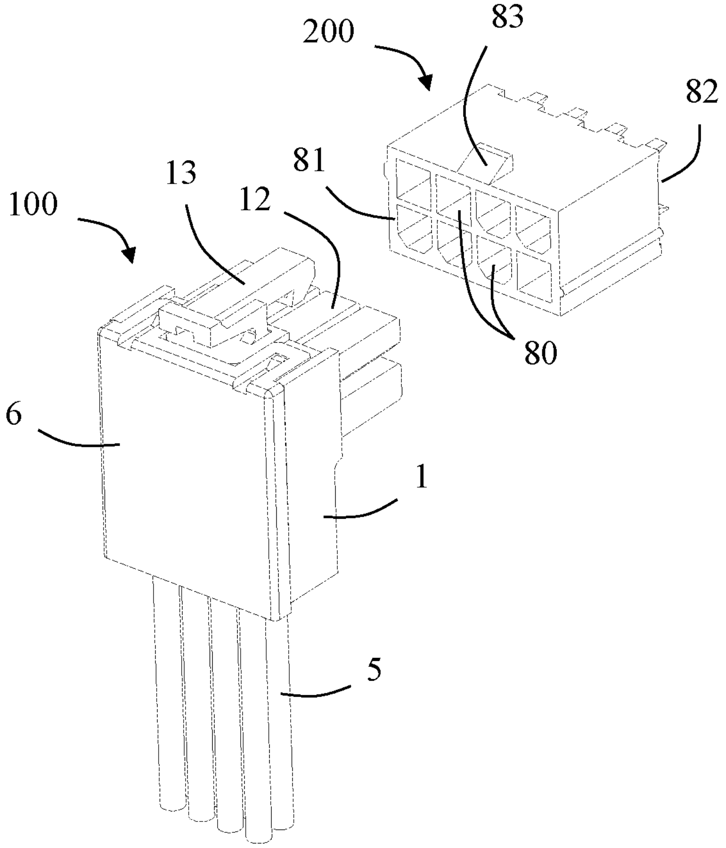
FIG. 3 is a perspective exploded view of FIG. 2 from another angle.

Referring to FIGS. 1 to 3, an embodiment of the present disclosure discloses a connector assembly 300 which includes an electrical connector 100 and a mating connector 200 matched with the electrical connector 100. In the illustrated embodiment of the present disclosure, the electrical connector 100 is a plug connector, and the mating connector 200 is a receptacle connector. Of course, in other embodiments, the electrical connector 100 and the mating connector 200 may also be of other types. In the illustrated embodiment of the present disclosure, the electrical connector 100 and the mating connector 200 are both power connectors. When the electrical connector 100 is plugged with the mating connector 200, the connector assembly 300 is used to transmit power.

Referring to FIGS. 2 and 3, the mating connector 200 includes a mating insulating body 8 and at least one mating conductive terminal 9 secured in the mating insulating body 8. The mating insulating body 8 includes a mating surface 81, a mounting surface 82 and a mating receiving cavity 80 formed extending through the mating surface 81. In a first embodiment of the mating connector 200, a plurality of mating receiving cavities 80 are provided and arranged in a matrix. Specifically, the mating receiving cavities 80 are arranged in a 2*4 matrix, wherein the mating receiving cavities 80 are independent of each other. That is, each of the mating receiving cavities 80 is formed by being surrounded by four peripheral wall portions (e.g., a top wall, a bottom wall, a left side wall and a right side wall). The mating insulating body 8 is also provided with a locking protrusion 83 protruding outward. The locking protrusion 83 is used for locking with a locking arm 13 of the electrical connector 100, so as to improve the reliability of the electrical connector 100 and the mating connector 200 when they are mated with each other.

A plurality of mating conductive terminals 9 are provided. Each of the mating conductive terminals 9 includes a pin-shaped insertion portion 91 extending into the mating receiving cavity 80 and a tail portion 92 extending beyond the mounting surface 82.

Referring to FIGS. 2 and 3, in a first embodiment of the mating connector 200, the mounting surface 82 and the mating surface 81 are parallel to each other. Each mating conductive terminal 9 is in the shape of a straight strip. The insertion portion 91 and the tail portion 92 are parallel to each other.

Figure 4:
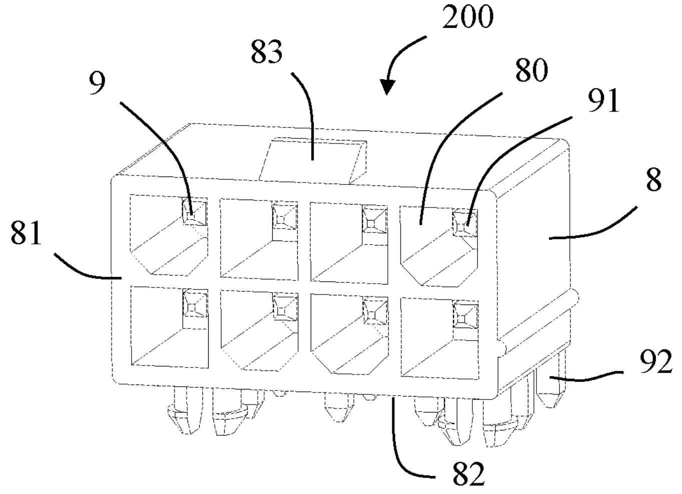
FIG. 4 is a perspective view of a mating connector in FIG. 3 in another embodiment.
Figure 5:
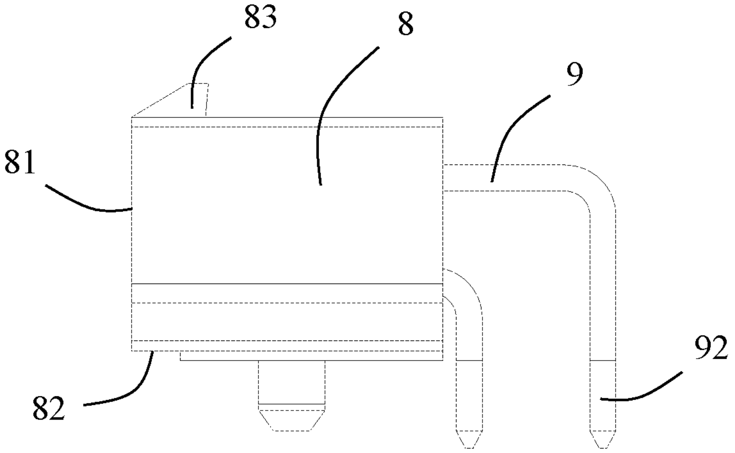
FIG. 5 is the front view of FIG. 4.
Figure 6:
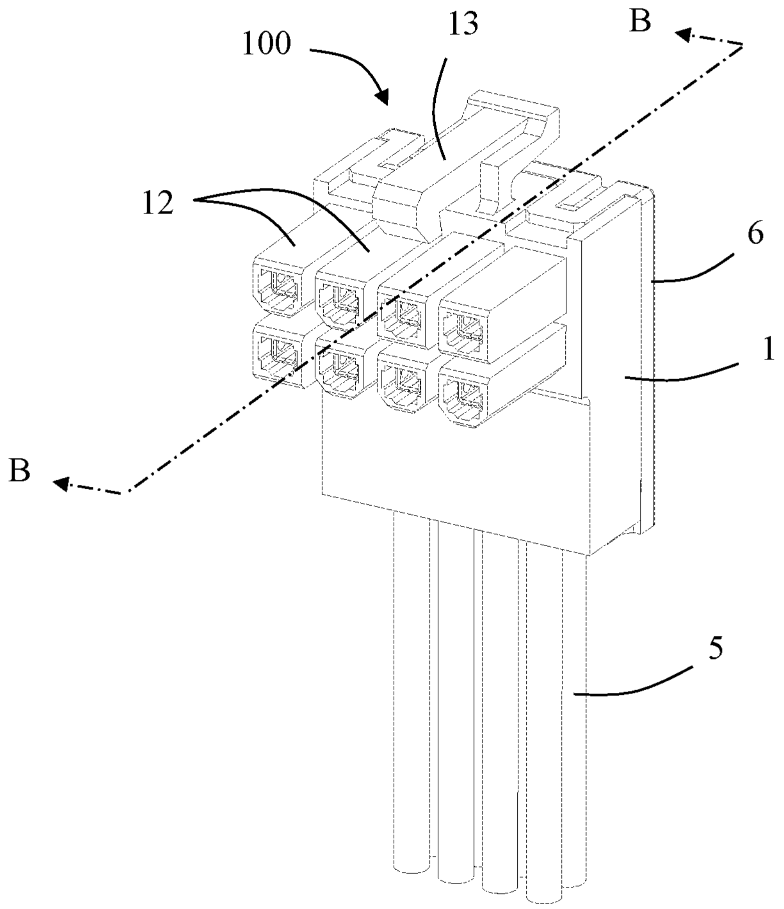
FIG. 6 is a perspective view of an electrical connector in FIG. 2 from another angle.
Figure 7:
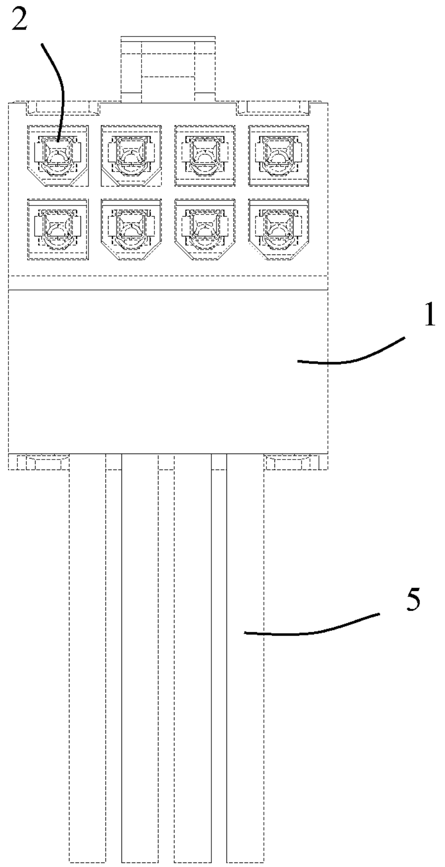
FIG. 7 is a front view of FIG. 6.
Figure 8:
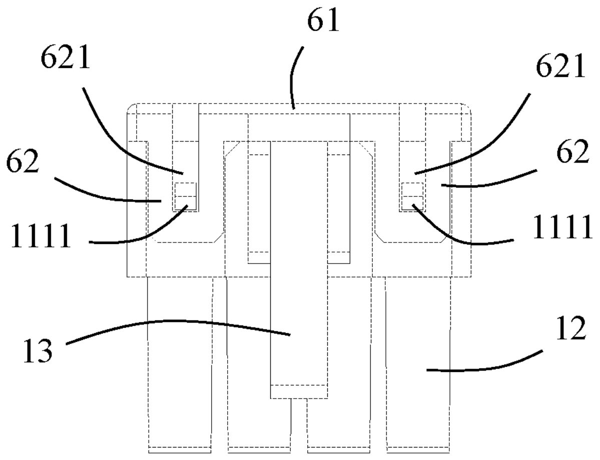
FIG. 8 is a top view of FIG. 6.

Referring to FIGS. 4 and 5, in a second embodiment of the mating connector 200, the mounting surface 82 and the mating surface 81 are perpendicular to each other. Each mating conductive terminal 9 is L-shaped. The insertion portion 91 and the tail portion 92 are perpendicular to each other.

Referring to FIGS. 6 to 15, in the embodiment shown in the present disclosure, the electrical connector 100 includes an insulating body 1, at least one conductive terminal 2, a support plate 3, an adapter circuit board 4, a cable 5 and an end cover 6.

Figure 14:
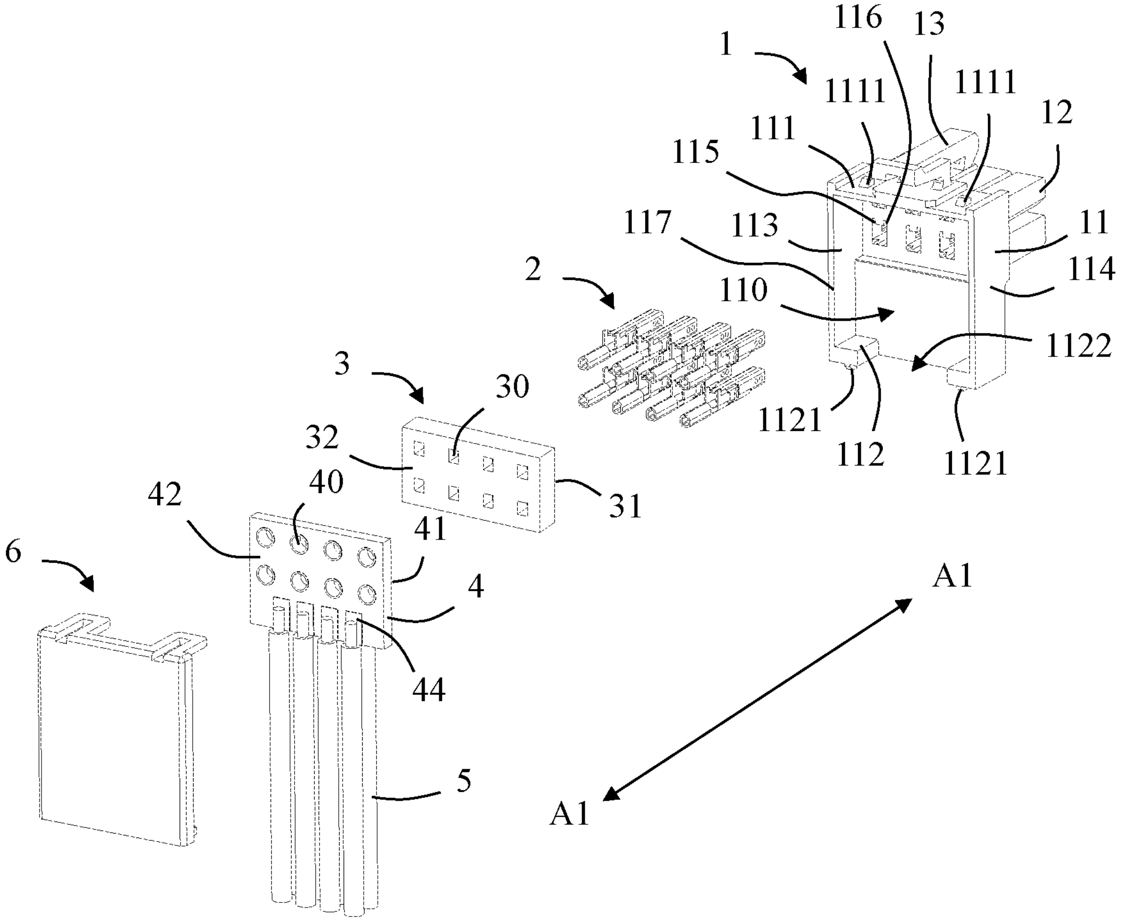
FIG. 14 is a further partial perspective exploded view of FIG. 12.

Referring to FIG. 14, the insulating body 1 includes a main body portion 11 and at least one mating protrusion 12 extending beyond the main body portion 11 along a first direction A1-A1 (e.g., a front-rear direction). The main body portion 11 includes a first wall portion 111, a second wall portion 112 opposite to the first wall portion 111, a first side wall 113 connecting one side of the first wall portion 111 and one side of the second wall portion 112, a second side wall 114 connecting the other side of the first wall portion 111 and the other side of the second wall portion 112, and an installation space 110 surrounded by the first wall portion 111, the second wall portion 112, the first side wall 113 and the second side wall 114. The body portion 11 includes a rear end surface 117. The installation space 110 extends through the rear end surface 117 backwardly along the first direction A1-A1.

The first wall portion 111 is provided with a plurality of first locking protrusions 1111 protruding upwardly. The second wall portion 112 is provided with a plurality of second locking protrusions 1121 protruding downwardly. The second wall portion 112 is further provided with a cable escape slot 1122 which extends through the second wall portion 112 downwardly and communicates with the installation space 110.

Figure 9:
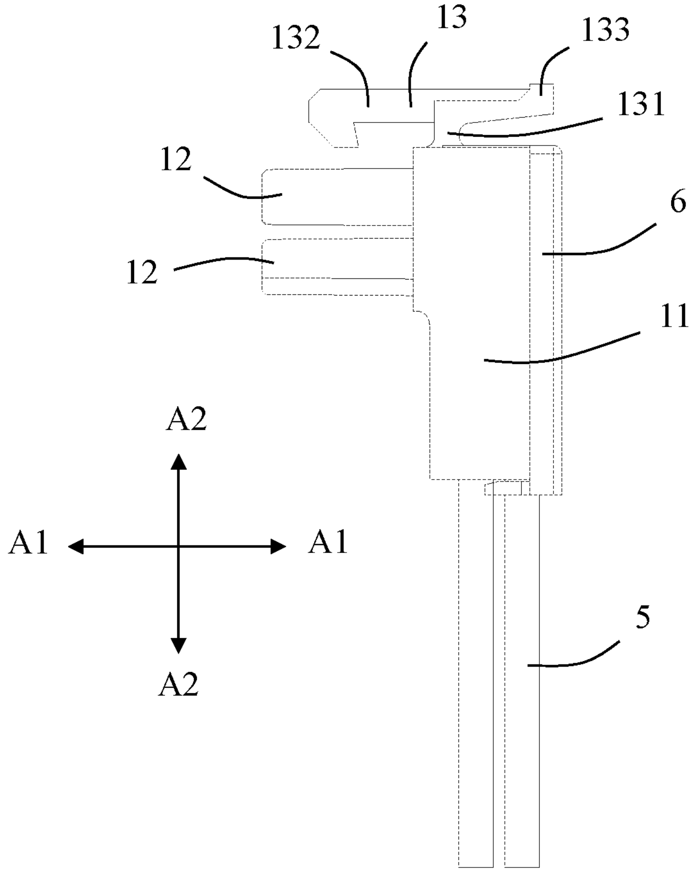
FIG. 9 is a right side view of FIG. 6.
Figure 10:
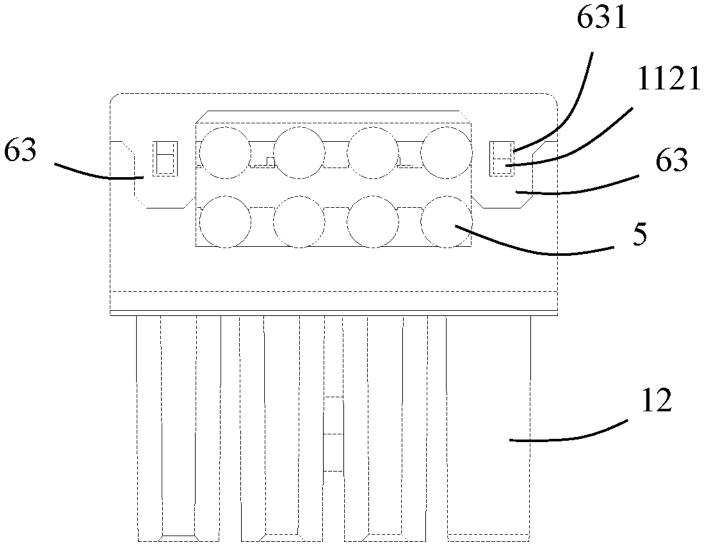
FIG. 10 is a bottom view of FIG. 6.

In addition, the insulating body 1 further includes a locking arm 13 fixed to the first wall portion 111 and integrally formed with the main body portion 11. The locking arm 13 extends beyond the main body portion 11 along the first direction A1-A1. Referring to FIG. 9, the locking arm 13 includes a fulcrum 131 fixed to the first wall 111, a retaining arm 132 protruding forwardly from the fulcrum 131, and a pressing portion 133 protruding backwardly from the fulcrum 131. The locking arm 13 is deformable with the fulcrum 131 as a pivot, so as to realize the mutual locking and unlocking of the retaining arm 132 and the locking protrusion 83.

In the embodiment shown in the present disclosure, a plurality of mating protrusions 12 are provided and arranged in a matrix. Specifically, the mating protrusions 12 are arranged in a 2*4 matrix, and any two adjacent mating protrusions 12 are arranged at intervals. The mating protrusions 12 are configured to be inserted into the mating receiving cavity 80 of the mating connector 200. Each of the mating protrusions 12 includes a terminal receiving groove 120 extending therethrough along the first direction A1-A1. The terminal receiving groove 120 communicates with the installation space 110. The terminal receiving groove 120 is used for receiving the conductive terminal 2. In addition, corresponding to each terminal receiving groove 120. The main body portion 11 further includes a first positioning groove 115 and a second positioning groove 116. The first positioning groove 115 and the second positioning groove 116 communicate with the terminal receiving groove 120. The first positioning groove 115 and the second positioning groove 116 are configured for positioning the conductive terminal 2.

Figure 16:
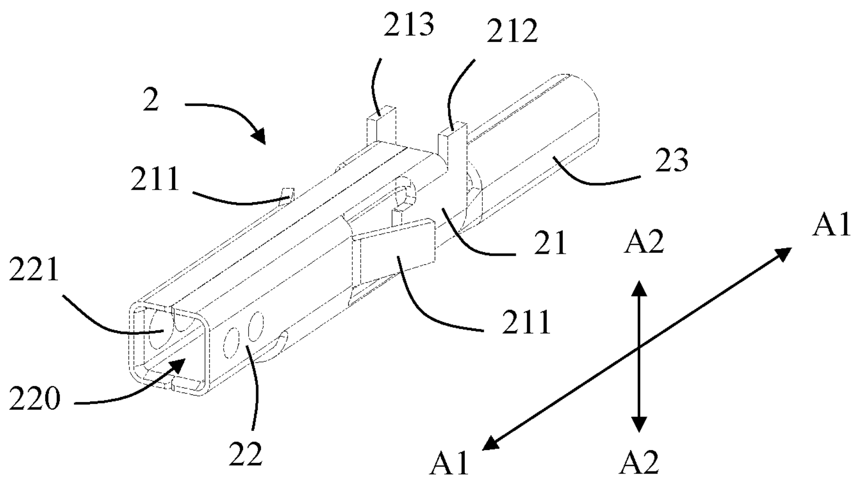
FIG. 16 is a perspective view of a conductive terminal in FIG. 15.
Figure 17:
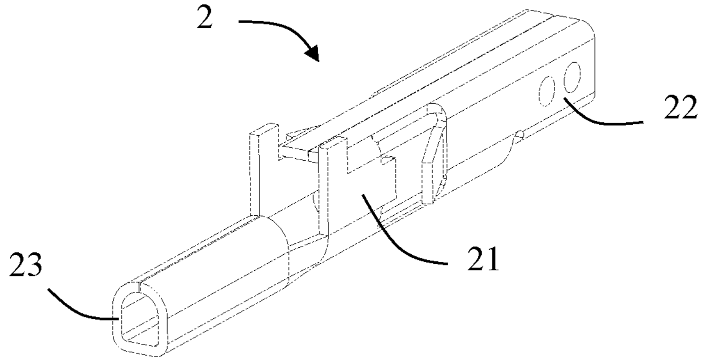
FIG. 17 is a perspective view of FIG. 16 from another angle.
Figure 18:
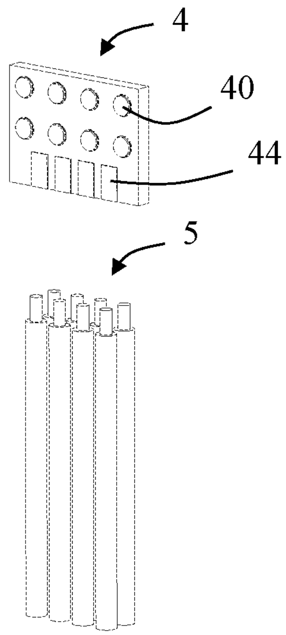
FIG. 18 is an exploded perspective view of an adapter circuit board and a cable in FIG. 14.
Figure 19:
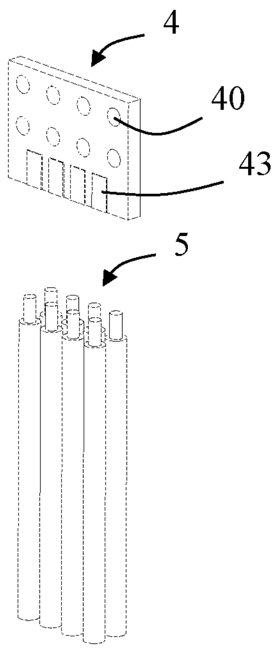
FIG. 19 is a perspective exploded view of FIG. 18 from another angle.

In the embodiment shown in the present disclosure, a plurality of conductive terminals 2 are provided and are secured in the terminal receiving grooves 120. Referring to FIGS. 16 and 17, each conductive terminal 2 includes a fixing portion 21 secured in the insulating body 1, a mating portion 22 located on one side of the fixing portion 21, and a mounting portion 23 located on an opposite side of the fixing portion 21. The mating portion 22, the fixing portion 21 and the mounting portion 23 extend along the first direction A1-A1.

The fixing portion 21 includes inclined abutting portions 211 extending outward from two sides of the fixing portion 21, and a first positioning protrusion 212 and a second positioning protrusions 213 which extend upwardly from a top of the fixing portion 21, respectively. The first positioning protrusion 212 is fixed in the first positioning groove 115. The second positioning protrusion 213 is fixed in the second positioning groove 116. When the conductive terminal 2 is inserted into the terminal receiving groove 120, the inclined abutting portions 211 are firstly deformed by pressing inward. When the conductive terminal 2 is installed in place, the inclined abutting portions 211 release the elastic force, and are then locked in the insulating body 1 so as to prevent the conductive terminal 2 from being separated from the insulating body 1 along a direction opposite to an insertion direction.

In the embodiment shown in the present disclosure, the mating portion 22 of the conductive terminal 2 is in the shape of a sleeve. The mating portion 22 includes a mating space 220 configured to receive the insertion portion 91 of the mating conductive terminal 9. The mating portion 22 is located in the terminal receiving groove 120, that is, the mating portion 22 does not extend beyond the mating protrusion 12. The mating portion 22 is further provided with a plurality of engaging dimples 221 protruding inwardly into the mating space 220, so as to improve the plugging force when mating with the insertion portion 91 of the mating conductive terminal 9.

The mounting portion 23 of the conductive terminal 2 is in the shape of a sleeve. The mounting portion 23 of the conductive terminal 2 is formed by winding a metal sheet. In the embodiment shown in the present disclosure, the conductive terminal 2 is also formed by stamping, bending and winding a piece of metal sheet as a whole. Compared with the sheet-shaped structure, the sleeve-shaped mounting portion 23 has a larger outer surface, which is beneficial to improve the connection reliability with the adapter circuit board 4. The mounting portion 23 of the conductive terminal 2 extends backwardly into the installation space 110.

Figure 11:
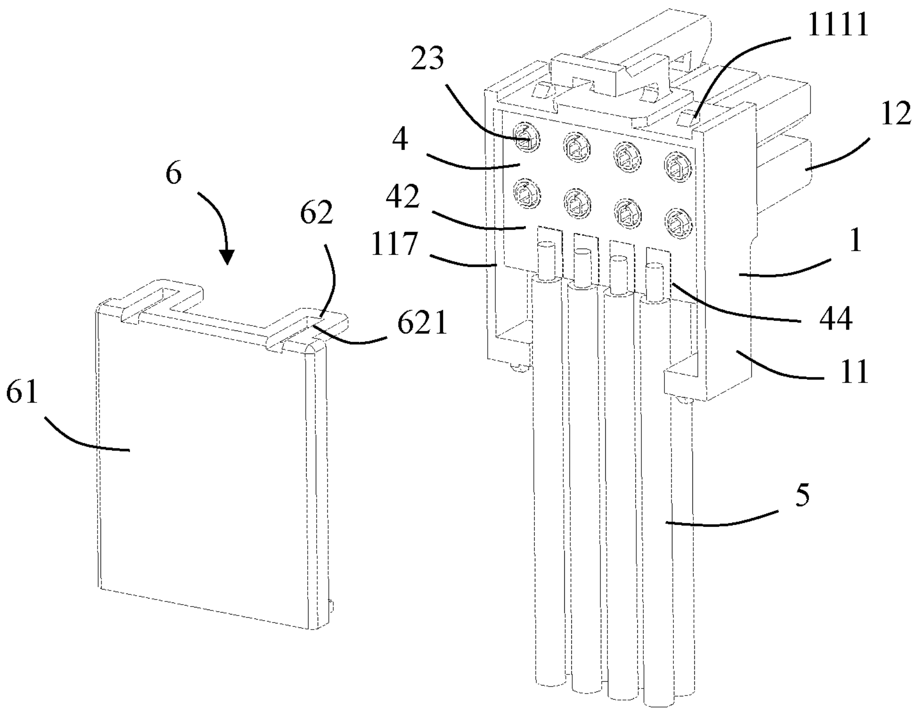
FIG. 11 is a partial perspective exploded view of the electrical connector in accordance with an embodiment of the present disclosure.
Figure 12:
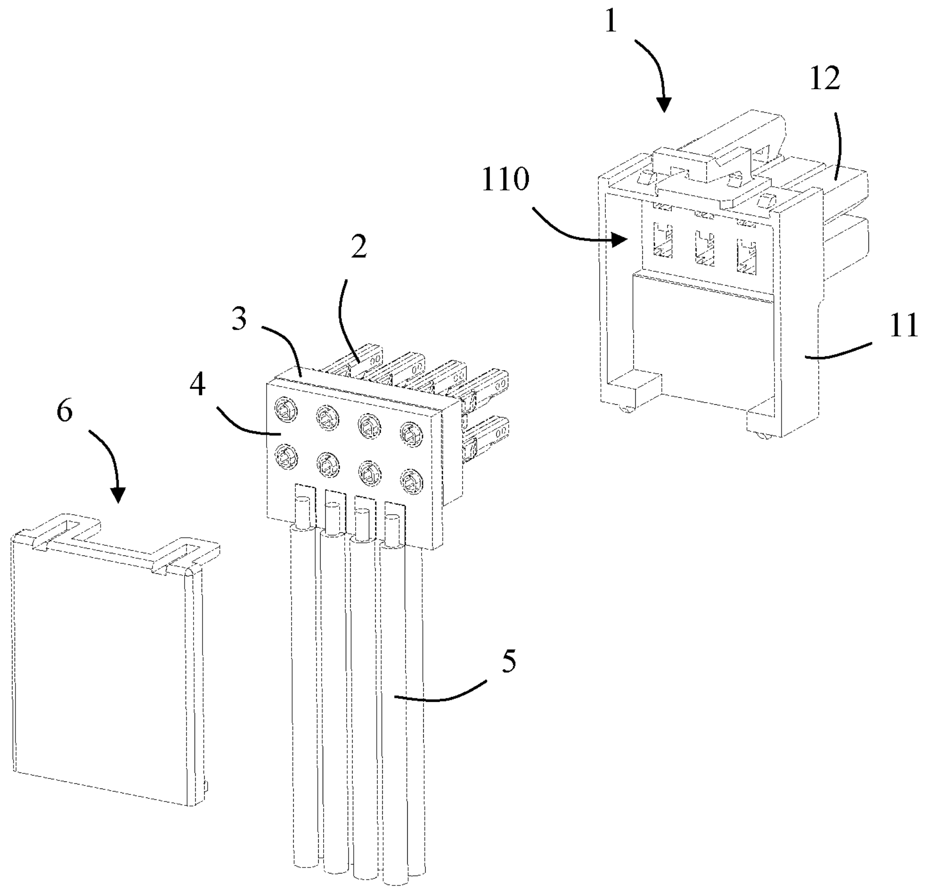
FIG. 12 is a further partial perspective exploded view of FIG. 11.
Figure 13:
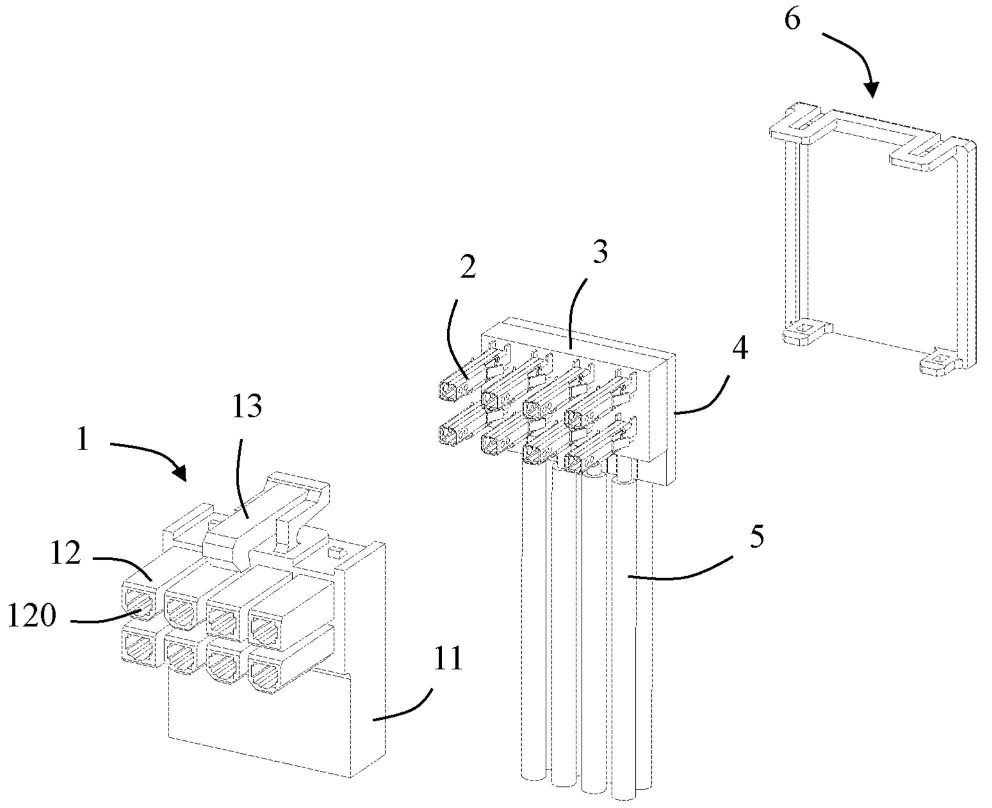
FIG. 13 is a partially exploded perspective view of FIG. 12 from another angle.
Figure 15:
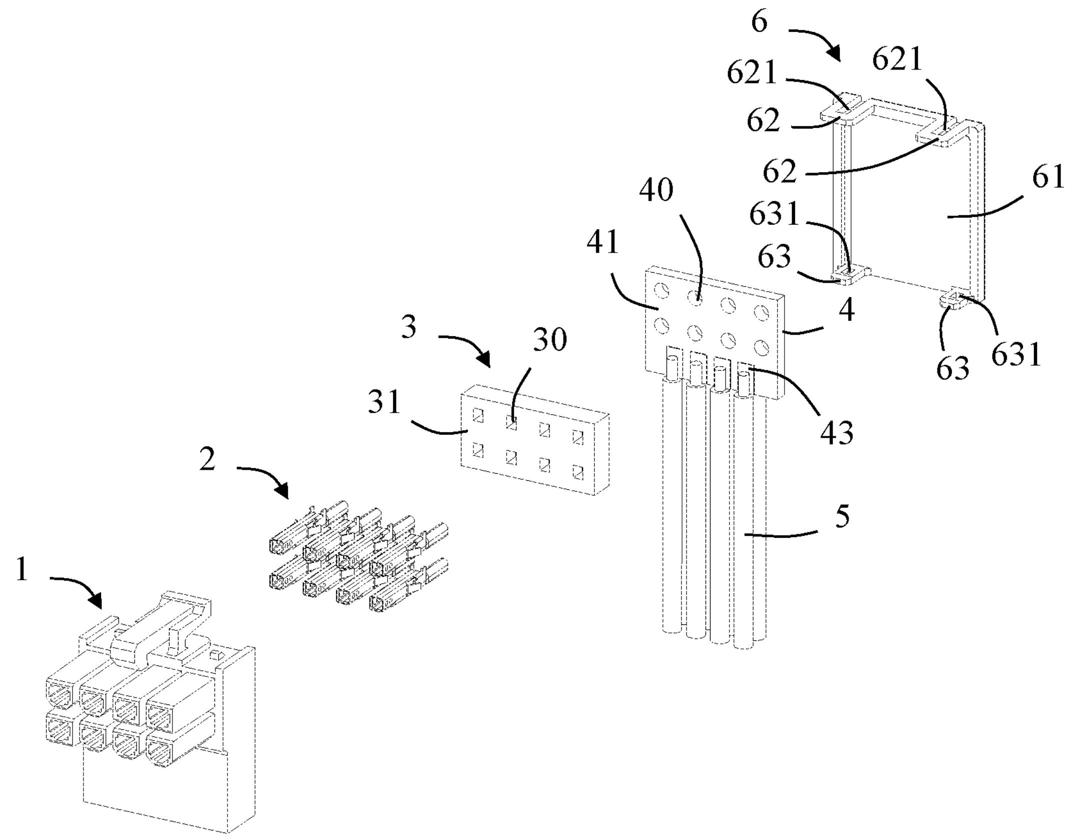
FIG. 15 is a partially exploded perspective view of FIG. 14 from another angle.

Referring to FIG. 11, FIG. 14 and FIG. 15, the support plate 3 and the adapter circuit board 4 are received in the installation space 110. The support plate 3 includes a first surface 31, a second surface 32 opposite to the first surface 31, and a plurality of through holes 30 extending through the first surface 31 and the second surface 32. The support plate 3 is mounted to the conductive terminal 2. The mounting portion 23 of the conductive terminal 2 passes through the through hole 30 and extends beyond the second surface 32. The present disclosure can further adjust the position of the conductive terminal 2 by arranging the support plate 3, thereby facilitating the subsequent installation of the adapter circuit board 4.

Referring to FIGS. 14, 15, 18 to 20, the adapter circuit board 4 includes a front surface 41, a rear surface 42, a plurality of conductive holes 40 passing through the front surface 41 and the rear surface 42 along the first direction A1-A1, a plurality of first soldering pads 43 provided on the bottom of the front surface 41, and a plurality of second soldering pads 44 provided on the bottom of the rear surface 42. The transfer circuit board 4 is mounted to the conductive terminals 2. The mounting portions 23 of the conductive terminals 2 are inserted into the conductive holes 40. The conductive terminals 2 are electrically connected to the adapter circuit board 4. Specifically, the mounting portions 23 of the conductive terminals 2 extending beyond the support plate 3 are inserted into the conductive holes 40, and partially extend beyond the rear surface 42. In an embodiment of the present disclosure, the mounting portions 23 of the conductive terminals 2 are press-fitted into the conductive holes 40, so that the conductive terminals 2 are electrically connected to the adapter circuit board 4. At this time, the mounting portions 23 are in direct contact with inner walls of the conductive holes 40. In another embodiment of the present disclosure, the mounting portions 23 of the conductive terminals 2 are soldered or welded to the conductive holes 40, so that the conductive terminals 2 are electrically connected to the adapter circuit board 4. Before soldering or welding, the size of each conductive hole 40 is designed to be larger than the size of the mounting portion 23, which facilitates the insertion of the mounting portion 23 into the conductive hole 40 more easily. When the mounting portion 23 is inserted in place, an annular gap is formed between an outer surface of the mounting portion 23 and the inner surface of the conductive hole 40. For example, during soldering, solder fills the annular gap, so as to electrically connect the mounting portion 23 and the conductive hole 40.

The front surface 41 of the transition circuit board 4 abuts against the second surface 32 of the support board 3. In another embodiment of the present disclosure, the adapter circuit board 4 is detachably connected to the mounting portions 23 of the conductive terminals 2. The transfer circuit board 4 is provided with a plurality of internal conductive circuits (not shown). In the illustrated embodiment of the present disclosure, the electrical connector 100 is a power connector. Compared with the conventional circuit boards, the conductive circuits of the adapter circuit board 4 require to be thickened or widened, so that the mating conductive terminals 9 of the mating connector 200, the conductive terminals 2 of the electrical connector 100, the conductive circuits of the adapter circuit board 4 and the cable 5 can all withstand a current of 10 A.

Figure 20:
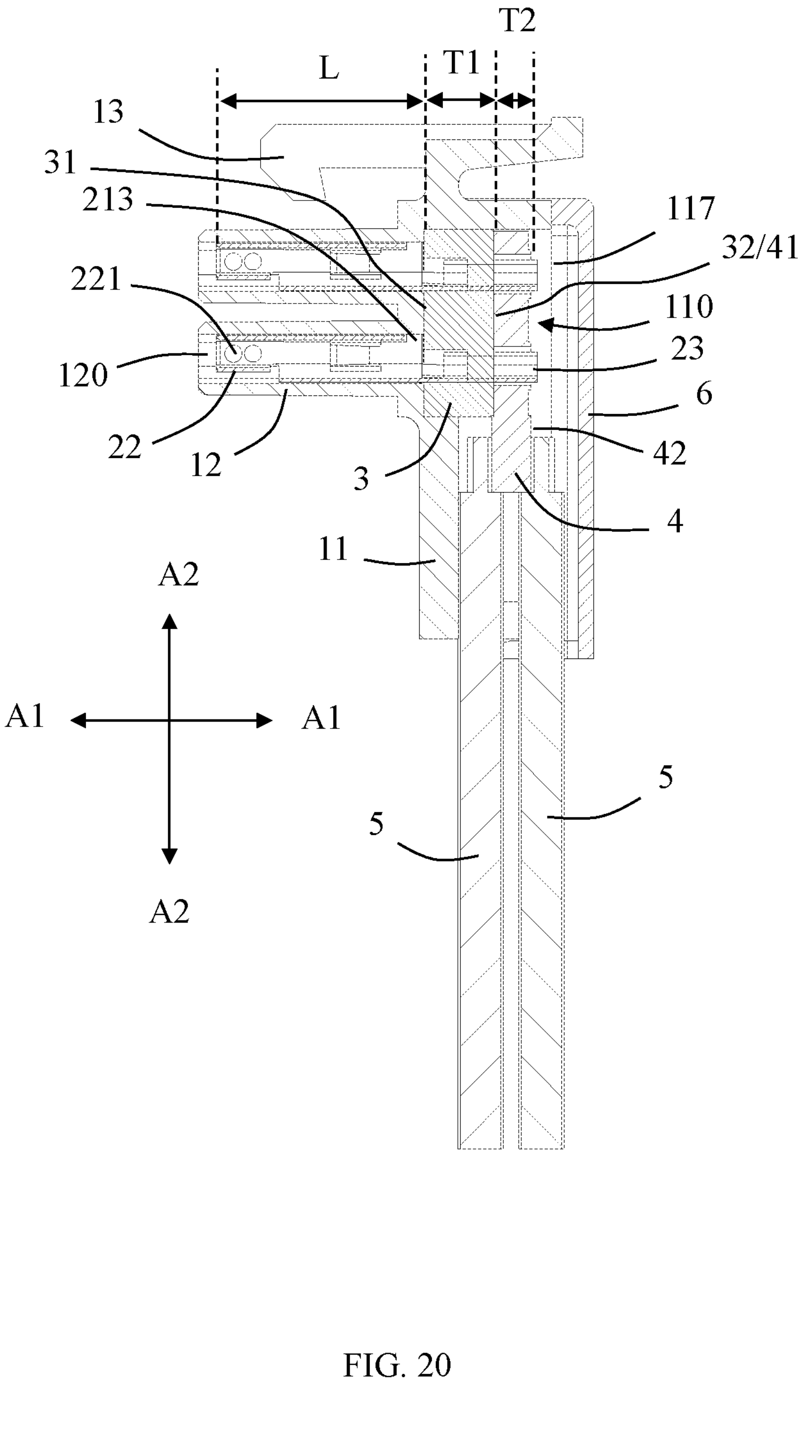
FIG. 20 is a schematic cross-sectional view taken along line B-B in FIG. 6.

In addition, by adjusting the thickness of the support plate 3, the installation depth of the support plate 3 and the installation depth of the adapter circuit board 4 can be adjusted, so as to have better adaptability. In the present disclosure, the support plate 3 and the transition circuit board 4 are received in the installation space 110. With this arrangement, a length of the main body portion 11 along the first direction A1-A1 can be used to receive the support plate 3 and the transition circuit board 4, thereby saving space. Referring to FIG. 20, in the embodiment shown in the present disclosure, the rear surface 42 of the adapter circuit board 4 is located inside the rear surface 117 of the main body portion 11. In other words, the rear surface 42 of the transition circuit board 4 does not extend beyond the rear surface 117 of the main body portion 11.

Referring to FIG. 20, in the embodiment shown in the present disclosure, a thickness of the support plate 3 along the first direction A1-A1 is T1, a thickness of the transition circuit board 4 along the first direction A1-A1 is T2, and a length of the conductive terminal 2 extending forwardly from the support plate 3 along the first direction A1-A1 is L, where: L>T1+T2.

The cable 5 is electrically connected to the adapter circuit board 4. Specifically, the cable 5 is divided into an inner layer and an outer layer, which are soldered or welded to the first soldering pads 43 and the second soldering pads 44, respectively. The conductive terminal 2 is electrically connected to the cable 5 through the adapter circuit board 4. The cable 5 extends in a second direction A2-A2. The first direction A1-A1 and the second direction A2-A2 are perpendicular to each other. The cable 5 passes through the cable escape slot 1122 along the second direction A2-A2 to extend beyond the second wall portion 112 and the end cover 6.

Referring to FIGS. 11 to 15, the end cover 6 is fastened to the insulating body 1 to shield the installation space 110. The end cover 6 is provided with an end wall 61 for shielding the adapter circuit board 4, a first extension protrusion 62 protruding from one side of the end wall 61 and extending toward the insulating body 1, and a second extension protrusion 63 protruding from the other side of the end wall 61 and extending toward the insulating body 1. The end wall 61 is in the shape of a flat plate, and has a relatively thin thickness along the first direction A1-A1, so as to shorten the size of the electrical connector 100. The first extension protrusion 62 is provided with a first locking groove 621 for locking the first locking protrusion 1111. The second extension protrusion 63 is provided with a second locking groove 631 for locking the second locking protrusion 1121.

The present disclosure also discloses a method for manufacturing the electrical connector 100, which includes the following steps:

S1, providing the insulating body 1;

S2, providing the conductive terminal 2, and assembling the conductive terminal 2 to the insulating body 1;

S3, providing the adapter circuit board 4 and the cable 5, and soldering or welding the cable 5 to the adapter circuit board 4; and S4, mounting the adapter circuit board 4 and the cable 5 as a whole to the mounting portion 23 of the conductive terminal 2.

Specifically, after step S2 and before step S3, the method further includes the following step:

S21, providing the support plate 3, and mounting the support plate 3 to the mounting portion 23 of the conductive terminal 2.

In addition, after step S5, the method further includes the following step:

S6, providing the end cover 6, and the end cover 6 being fastened to the insulating body 1 to shield the installation space 110.

When the electrical connector 100 is mated with the mating connector 200, the mating protrusions 12 of the electrical connector 100 are inserted into the mating receiving cavity 80 of the mating connector 200, and the insertion portions 91 of the mating conductive terminals 9 are inserted into the mating portions 22 of the conductive terminals 2.

Compared with the prior art, the present disclosure is provided with the adapter circuit board 4, and the conductive terminal 2 is electrically connected to the cable 5 through the adapter circuit board 4. The present disclosure avoids the problem that the cable 5 needs to be bent when the cable 5 is directly connected to the conductive terminal 2, thereby saving space and facilitating miniaturization. In addition, the present disclosure is beneficial to improve the reliability of the electrical connection between the cable 5 and the conductive terminal 2.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. An electrical connector, comprising:

an insulating body defining a terminal receiving groove which extends along a first direction;

a conductive terminal secured in the terminal receiving groove, the conductive terminal comprising a fixing portion fixed in the insulating body, a mating portion located on one side of the fixing portion, and a mounting portion located on an opposite side of the fixing portion; wherein the mating portion, the fixing portion and the mounting portion extend along the first direction, and the mating portion is located in the terminal receiving groove;

an adapter circuit board comprising a conductive hole, the mounting portion of the conductive terminal being inserted into the conductive hole, the conductive terminal being electrically connected with the adapter circuit board; and a cable electrically connected to the adapter circuit board, the conductive terminal being electrically connected to the cable through the adapter circuit board, the cable extending in a second direction, the first direction and the second direction being perpendicular to each other;

wherein the insulating body comprises a main body portion, the main body portion comprises a first wall portion and a second wall portion disposed opposite to the first wall portion; and wherein the electrical connector further comprises an end cover secured to the insulating body; the first wall portion is provided with a plurality of first locking protrusions; the second wall portion is provided with a plurality of second locking protrusions; the end cover is provided with an end wall shielding the adapter circuit board, a plurality of first extension protrusions protruding from one side of the end wall and extending toward the insulating body, and a plurality of second extension protrusions protruding from another side of the end wall and extending toward the insulating body; the first extension protrusions are provided with a plurality of first locking grooves for locking the first locking protrusions, and the second extension protrusions are provided with a plurality of second locking grooves for locking the second locking protrusions.

2. The electrical connector according to claim 1, wherein the mounting portion of the conductive terminal is press-fitted into the conductive hole, so that the conductive terminal is electrically connected to the adapter circuit board; or the mounting portion of the conductive terminal is soldered or welded to the conductive hole, so that the conductive terminal is electrically connected to the adapter circuit board.

3. The electrical connector according to claim 1, further comprising a support plate, the support plate comprising a first surface, a second surface disposed opposite to the first surface, and a through hole extending through the first surface and the second surface, the support plate being mounted to the conductive terminal, the mounting portion of the conductive terminal passing through the through hole and extending beyond the second surface.

4. The electrical connector according to claim 3, wherein the adapter circuit board is mounted to the conductive terminal; and wherein the mounting portion of the conductive terminal extending beyond the support plate is inserted into the conductive hole, and the adapter circuit board abuts against the second surface of the support plate.

5. The electrical connector according to claim 3, wherein the insulating body comprises a mating protrusion extending from the main body portion along the first direction, the main body portion defines an installation space, the terminal receiving groove extends through the mating protrusion and communicates with the installation space, the mounting portion of the conductive terminal extends into the installation space, and the support plate and the adapter circuit board are received in the installation space.

6. The electrical connector according to claim 5, wherein a plurality of the mating protrusions are provided and arranged in a matrix, each of the mating protrusions is provided with the terminal receiving groove, and a plurality of the conductive terminals are provided and secured in corresponding terminal receiving grooves.

7. The electrical connector according to claim 5, wherein the insulating body comprises a locking arm fixed on the first wall portion and integrally formed with the main body portion, and the locking arm protrudes beyond the main body portion along the first direction.

8. The electrical connector according to claim 7, wherein the end cover is fastened to the insulating body to shield the installation space.

9. The electrical connector according to claim 8, wherein the cable extends beyond the second wall portion and the end cover along the second direction.

10. The electrical connector according to claim 1, wherein the fixing portion of the conductive terminal comprises a first positioning protrusion and a second positioning protrusion which protrude along the second direction; wherein the insulating body comprises a first positioning groove and a second positioning groove, the first positioning groove and the second positioning groove are communicated with the terminal receiving groove, the first positioning protrusion is fixed in the first positioning groove, and the second positioning protrusion is fixed in the second positioning groove.

11. The electrical connector according to claim 1, wherein the mating portion of the conductive terminal is sleeve-shaped, and the mating portion of the conductive terminal comprises a mating space configured to receive a mating conductive terminal.

12. The electrical connector according to claim 1, wherein the mounting portion of the conductive terminal is sleeve-shaped, and the mounting portion of the conductive terminal is formed by winding a metal sheet.

13. A method of manufacturing the electrical connector according to claim 1, the method comprising following steps:

S1, providing the insulating body;

S2, providing the conductive terminal and assembling the conductive terminal to the insulating body;

S3, providing the adapter circuit board and the cable, and soldering or welding the cable to the adapter circuit board; and S4, mounting the adapter circuit board and the cable as a whole to the mounting portion of the conductive terminal.

14. A connector assembly, comprising:

an electrical connector comprising:

an insulating body defining a terminal receiving groove which extends along a first direction;

a conductive terminal secured in the terminal receiving groove, the conductive terminal comprising a fixing portion fixed in the insulating body, a mating portion located on one side of the fixing portion, and a mounting portion located on an opposite side of the fixing portion; wherein the mating portion, the fixing portion and the mounting portion extend along the first direction, and the mating portion is located in the terminal receiving groove;

an adapter circuit board comprising a conductive hole, the mounting portion of the conductive terminal being inserted into the conductive hole, the conductive terminal being electrically connected with the adapter circuit board;

a support plate comprising a first surface, a second surface disposed opposite to the first surface, and a through hole extending through the first surface and the second surface, the support plate being mounted to the conductive terminal, and the mounting portion of the conductive terminal passing through the through hole and extending beyond the second surface; the support plate being configured to define a length of the mounting portion that extends beyond the second surface; and a cable electrically connected to the adapter circuit board, the conductive terminal being electrically connected to the cable through the adapter circuit board, the cable extending in a second direction, the first direction and the second direction being perpendicular to each other; and a mating connector comprising a mating insulating body and a mating conductive terminal fixed to the mating insulating body, the mating insulating body comprising a mating receiving cavity, the mating conductive terminal comprising a needle-shaped insertion portion extending into the mating receiving cavity;

wherein the insulating body is at least partially inserted into the mating receiving cavity, and the insertion portion of the mating conductive terminal is inserted into the mating portion of the conductive terminal.

15. The connector assembly according to claim 14, wherein the mating conductive terminal further comprises a tail portion, and the tail portion and the insertion portion are parallel or perpendicular to each other.

16. The connector assembly according to claim 14, wherein the mounting portion of the conductive terminal is press-fitted into the conductive hole, so that the conductive terminal is electrically connected to the adapter circuit board; or the mounting portion of the conductive terminal is soldered or welded to the conductive hole, so that the conductive terminal is electrically connected to the adapter circuit board.

17. The connector assembly according to claim 14, wherein the adapter circuit board is mounted to the conductive terminal; and wherein the mounting portion of the conductive terminal extending beyond the support plate is inserted into the conductive hole, and the adapter circuit board abuts against the second surface of the support plate.

18. The connector assembly according to claim 14, wherein the insulating body comprises a main body portion and a mating protrusion extending from the main body portion along the first direction, the main body portion defines an installation space, the terminal receiving groove extends through the mating protrusion and communicates with the installation space, the mounting portion of the conductive terminal extends into the installation space, and the support plate and the adapter circuit board are received in the installation space.

19. An electrical connector, comprising:

an insulating body defining a terminal receiving groove extending along a first direction;

a conductive terminal secured in the terminal receiving groove, the conductive terminal comprising a fixing portion secured in the insulating body, a mating portion located on one side of the fixing portion, and a mounting portion located on an opposite side of the fixing portion; wherein the mating portion, the fixing portion and the mounting portion extend along the first direction, and the mating portion is located in the terminal receiving groove;

a stiff adapter circuit board defining a conductive hole, the conductive terminal being electrically connected with the stiff adapter circuit board;

a stiff support plate comprising a first surface, a second surface disposed opposite to the first surface, and a through hole extending through the first surface and the second surface, the stiff support plate being mounted to the conductive terminal, and the mounting portion of the conductive terminal passing through the through hole, extending beyond the second surface and being inserted into the conductive hole; the stiff support plate being sandwiched between the insulating body and the stiff adapter circuit board; and a cable electrically connected to the stiff adapter circuit board, the conductive terminal being electrically connected to the cable through the stiff adapter circuit board, the cable extending in a second direction, the first direction and the second direction being perpendicular to each other.

20. The electrical connector according to claim 19, wherein the stiff support plate is configured to define a length of the mounting portion that extends beyond the second surface.

* * * * *